United States Patent [19]

Herzl

[11] 4,270,391
[45] Jun. 2, 1981

[54] FREQUENCY-RESPONSIVE FILTER FOR FLOWMETER TRANSMISSION SYSTEM

[75] Inventor: Peter J. Herzl, Morrisville, Pa.
[73] Assignee: Fischer & Porter Co., Warminster, Pa.
[21] Appl. No.: 69,361
[22] Filed: Aug. 24, 1979
[51] Int. Cl.[3] .............................................. G01F 1/32
[52] U.S. Cl. .................................................. 73/861.22
[58] Field of Search ........... 73/861.22, 861.23, 861.24; 307/233 R; 328/140, 146, 147, 149, 169

[56] References Cited
U.S. PATENT DOCUMENTS

| 3,638,037 | 1/1972 | McMurtrie | 328/167 |
| 3,709,034 | 1/1973 | Herzl | 73/861.18 |

Primary Examiner—Herbert Goldstein
Attorney, Agent, or Firm—Michael Ebert

[57] ABSTRACT

A transmission system for a vortex-shedding or swirl-type flowmeter whose meter signal lies in the low-frequency range and is therefore of low resolution, the meter signal being subject to jitter. In order to provide a jitter-free, high resolution output signal, the system includes an input amplifier responsive to the meter signal, the output of which is applied through a tracking filter to a Schmitt trigger. The trigger converts the meter signal into pulses of the same frequency which are fed into a frequency multiplier to produce a relatively high-frequency output signal of good resolution. The tracking filter serves to characterize the amplifier response to reduce the amplification gain thereof below a selected frequency level. The tracking filter operates in conjunction with a comparator assembly which compares an analog voltage whose magnitude depends on the meter signal frequency with a series of progressively increased reference voltages, each representing a predetermined frequency level. The assembly functions to render the filter operative in a stepwise manner, whereby when the meter frequency reaches any one of the predetermined frequency levels, the filter then acts effectively to reduce the amplification gain of the input amplifier to attenuate frequencies below that level, thereby minimizing the transmission of noise components in the meter signal.

9 Claims, 6 Drawing Figures

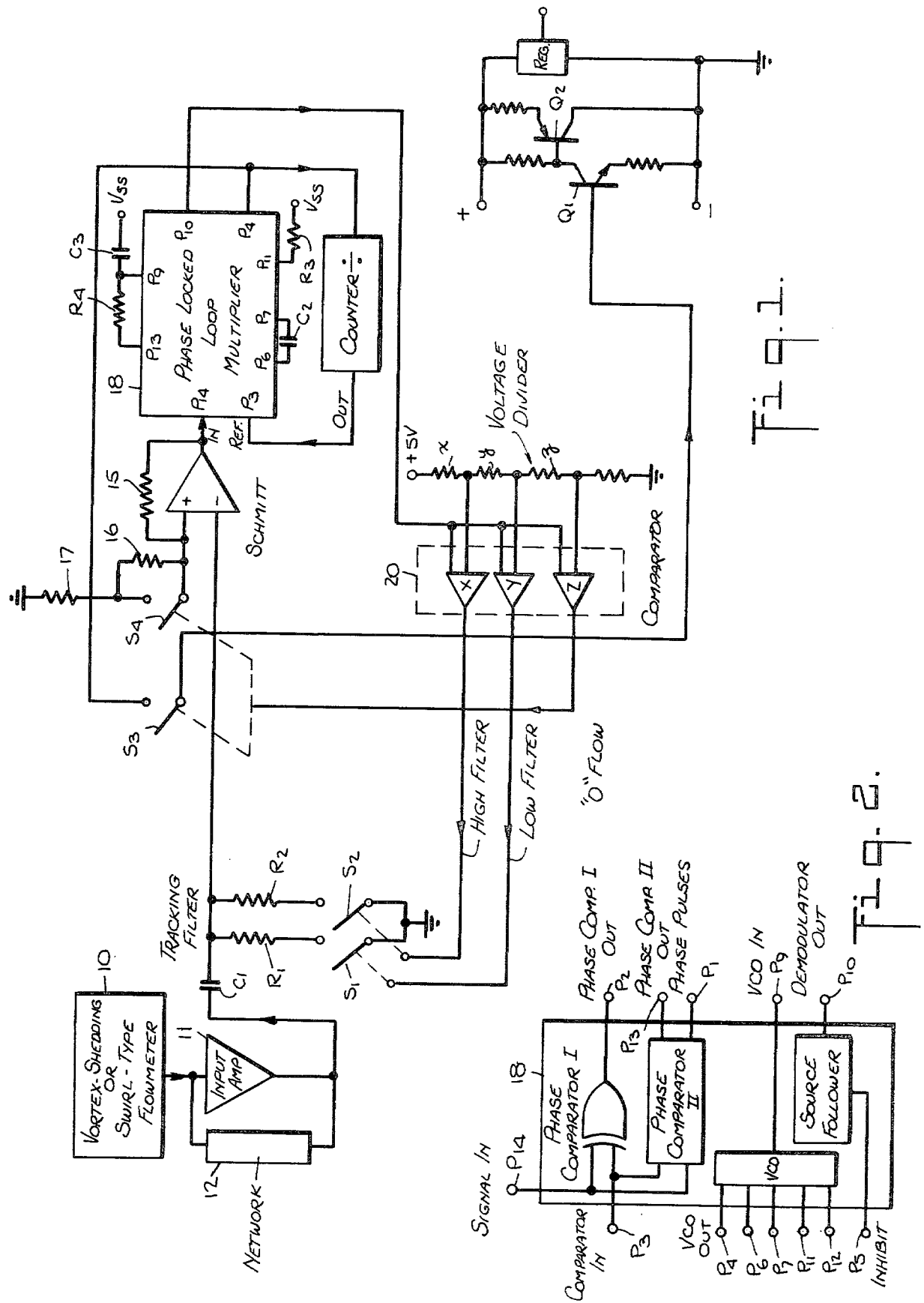

FREQUENCY-RESPONSIVE FILTER FOR FLOWMETER TRANSMISSION SYSTEM

BACKGROUND OF INVENTION

This invention relates generally to vortex-shedding flowmeter transmission systems and more particularly to a system of this type which is useful for both liquid and gas flow rate measurement and has a jitter-free output.

It is well known that under certain circumstances the presence of an obstacle or shedder in a flow conduit will give rise to periodic vortices. For small Reynolds numbers, the downstream wake is laminar in nature, but at increasing Reynolds numbers, regular vortex patterns are formed. These patterns are known as Karman vortex streets. The frequency at which vortices are shed in a Karman vortex street is a function of flow rate.

It is this phenomenon which is exploited to create a flowmeter to measure the volumetric flow of fluids being treated or supplied in order to carry out various control functions. Flowmeters of this type are disclosed in Bird U.S. Pat. No. 3,116,639, and in White U.S. Pat. No. 3,650,152. Existing flowmeters of the vortex shedding type, such as those disclosed in the Burgess U.S. Pat. No. 3,888,120 and the Herzl U.S. Pat. No. 4,162,238, are capable of effecting volumetric or mass flow measurement.

Though some vortex-shedding flowmeters have high accuracies, better than 0.5% of flowrate, or even in some instances 0.25% of flow rate, these accuracies are of little practical value in many situations by reason of the low resolution of the output as well as jitter effects. By "jitter" is meant small, rapid variations in the output as a result of fluid flow disturbances or other factors.

For example, a vortex-shedding flowmeter for liquid flow measurement having a six-inch diameter might have an output whose frequency lies in a range extending between 2 Hz and 30 Hz, depending on flowrate. With a 2 Hz output and with normal counting techniques, 500 seconds are required to obtain 1000 counts or 0.1% resolution. When calibrating this instrument against a volume or weight standard, a standard of adequate size (about 1000 gallons), would be required to contain the fluid passed by the flowmeter during this period.

If period or line measurement is employed, then a time variation of between 2% to 20% per cycle is encountered. This depends on shedder design, piping and installation parameters, and other factors. It therefore still requires a relatively prolonged period to obtain a 0.1% of rate measurement.

It is known that the effects of noise and jitter in a vortex-shedding meter can be minimized and signal quality improved by filtering out frequency components that are not part of the shedding frequency. Thus in the Herzl U.S. Pat. No. 3,709,034, there is disclosed a system including a signal conditioner associated with the output of the vortex-shedding meter. This conditioner is adapted to extract the dominant frequency representing flow rate from the composite output signal frequency and to exclude high and low frequency noise components, whereby by measuring only the dominant frequency, one obtains an accurate reading of fluid flow quantity. But in this known arrangement, the output frequency is within a low frequency range and the resolution of the output is low.

As pointed out in Herzl U.S. Pat. No. 4,123,940, multiplication of the output frequency of a vortex meter is especially important for large meters where the dominant or natural frequencies are very low and where it is therefore difficult to obtain adequate resolution and reasonable time constants without frequency multiplication. But while the arrangement disclosed in this prior patent serves to improve the resolution of the output, it does not reduce jitter. Indeed, severe jitter may actually give rise to multiplication errors.

Another problem encountered with vortex-shedding meters and also with Swirlmeters which yield a low-frequency meter signal whose frequency is a function of flow rate is the generation of spurious signal components even at zero flow rate. These signal components, which are from hydraulic, electrical or mechanical noise, result in inaccurate readings of flow rate.

SUMMARY OF INVENTION

In view of the foregoing, the main object of this invention is to provide a system for transmitting the output of a vortex or swirl-type flowmeter to produce an output signal which is stable and has a high-resolution and is therefore suitable for transmission on a two-wire line or for any other purpose calling for a signal whose frequency is a function of the flow rate of a fluid being metered.

More particularly, it is an object of this invention to provide a transmission system of the above type in which the low frequency of the meter signal is multiplied to produce a high-resolution output signal that is free of jitter noise.

Yet another object of the invention is to provide a system of the above type having an improved signal-to-noise ratio, the output of the system being cut-off when the meter frequency falls below a predetermined minimum level in the operating range, thereby rendering the system insensitive to spurious signal components.

Also an object of the invention is to provide a system which operates reliably and efficiently and which may be manufactured at relatively low cost.

Briefly stated, these objects are attained in a transmission system for a vortex-shedding or swirl-type flowmeter whose meter signal lies in the low-frequency range and is therefore of low resolution, the meter signal being subject to jitter. In order to provide a jitter-free, high resolution output signal, the system includes an input amplifier responsive to the meter signal, the output of which is applied through a tracking filter to a Schmitt trigger.

The trigger converts the meter signal into pulses of the same frequency which are fed into a frequency multiplier to produce a relatively high-frequency output signal of good resolution. The tracking filter serves to characterize the amplifier response to effectively reduce the amplification gain thereof below a selected frequency level. The tracking filter operates in conjunction with a comparator assembly that compares an analog voltage whose magnitude depends on the meter signal frequency with a series of progressively increased references voltages, each representing a predetermined frequency level. The assembly functions to render the filter operative in a stepwise manner, whereby when the meter frequency reaches any one of the predetermined frequency levels, the filter then acts effectively to reduce the amplification gain of the input amplifier to attenuate frequencies below that level, thereby minimizing the transmission of noise components in the meter signal.

OUTLINE OF DRAWINGS

For a better understanding of the invention as well as other objects and further features thereof, reference is made to the following detailed description to be read in conjunction with the accompanying drawings, wherein:

FIG. 1 is a schematic diagram of a preferred embodiment of a system in accordance with the invention for transmitting the output of a vortex-shedding swirl-type flowmeter;

FIG. 2 is a block diagram of the phase-locked loop unit included in the system;

Figure 4:
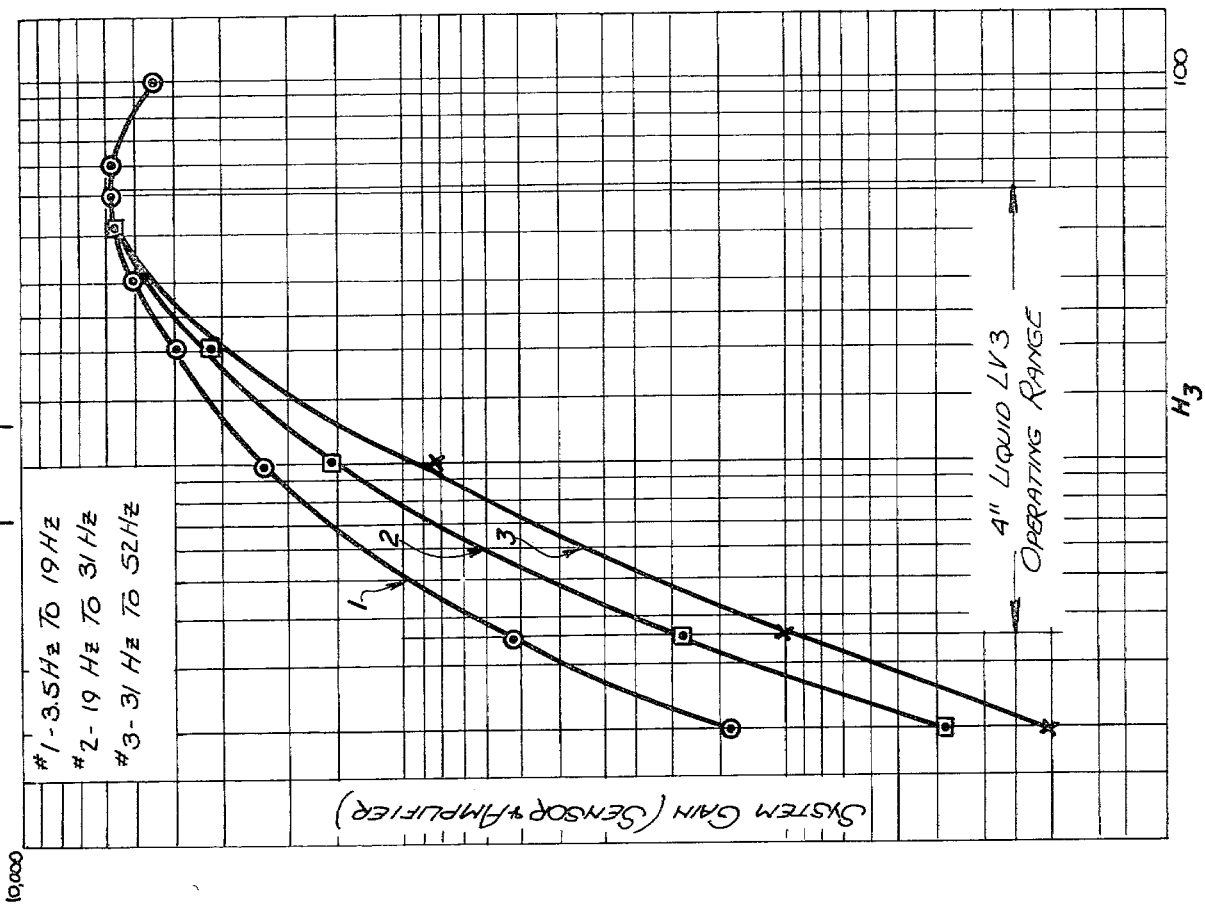
Figure 3:
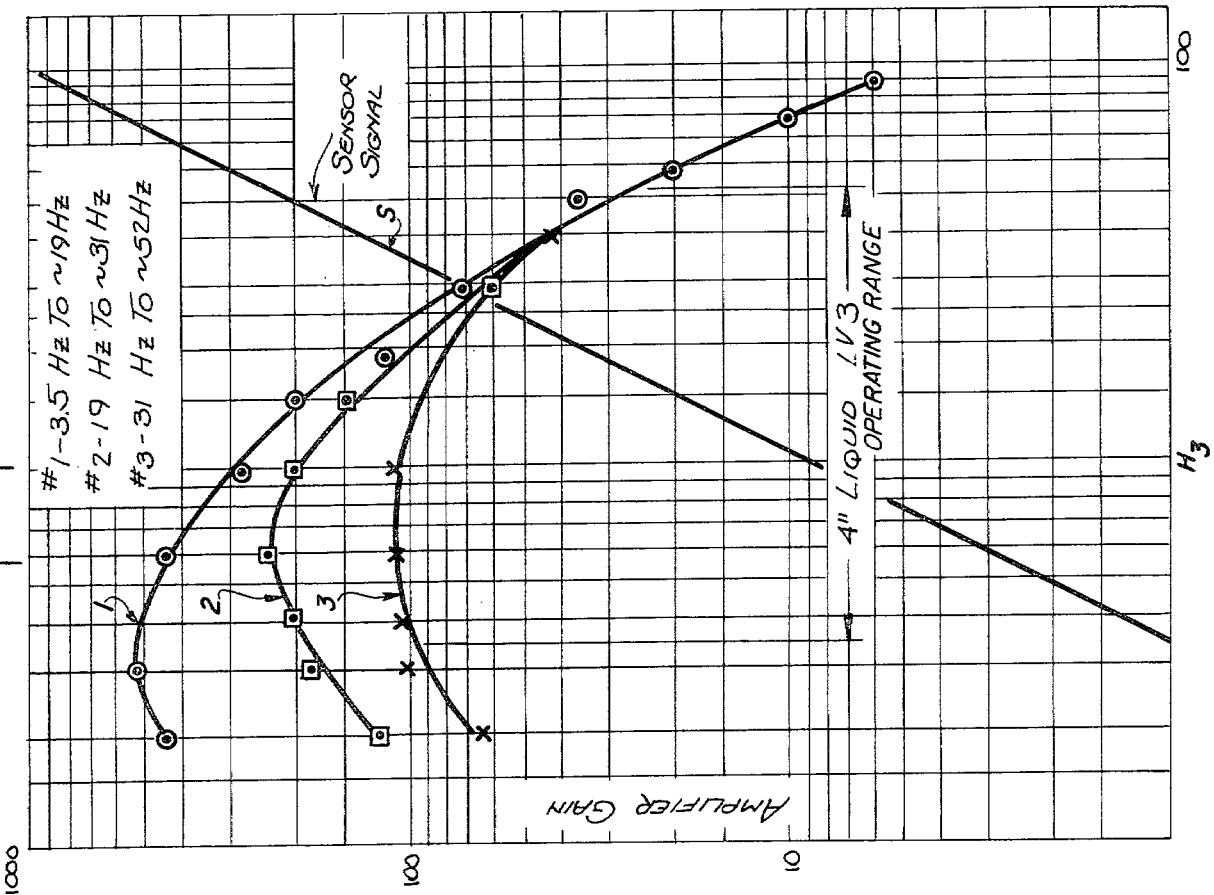
Figure 5:
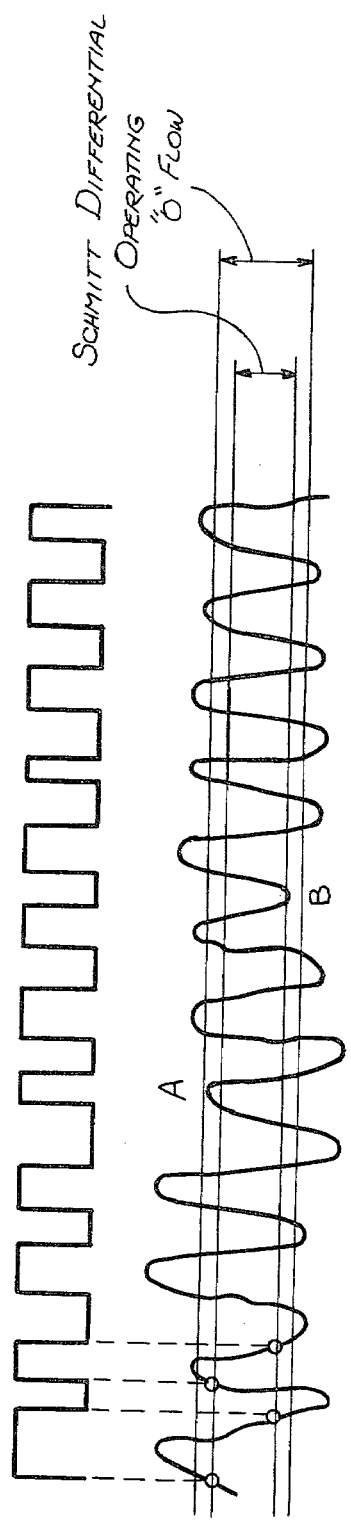
Figure 6:
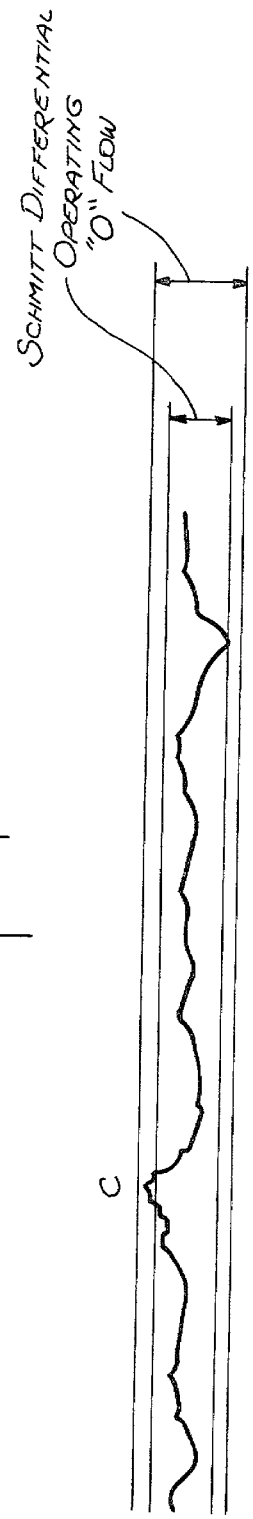

FIG. 3 contains curves representing the effect of the tracking filter included in the system on the input amplifier gain;

FIG. 4 contains curves indicative of the system gain when a pressure or force sensor is employed in conjunction with an input amplifier whose characteristic curve is shown in FIG. 3;

FIG. 5 shows the effect of Switching the differential of the Schmitt trigger included in the system at minimum flow; and FIG. 6 illustrates the noise signal at zero flow.

DESCRIPTION OF INVENTION

Referring now to FIG. 1, there is shown a system in accordance with the invention for transmitting the output of a vortex-shedding flowmeter 10 so that the transmitted output is a stable, jitter-free, high resolution signal which is suitable for transmission on a two-wire line, or for use in a time-shared arrangement, or for any other purpose requiring a signal whose frequency is a function of the flow rate of a liquid or gas being metered. Flowmeter 10 may be constituted by any commercially-available type or may be of the types disclosed in the above-identified patents.

In lieu of a vortex-shedding flowmeter, the fluid may be measured by a swirl-type flowmeter or "Swirlmeter" of the type disclosed in U.S. Pat. Nos. 3,279,251; 3,314,289 and U.S. Pat. No. Re. 26,410, among others. In a swirlmeter, the fluid whose flow rate is to be measured is forced to assume a swirl component by means of swirl blades, the arrangement being such that the swirling motion is transformed into precessional movement to produce fluidic pulses which are sensed to yield a signal whose frequency is proportional to flow rate. The invention is applicable to either a vortex-type or swirl-type flowmeter.

Preferably, the signal yielded by meter 10 is one generated by a force or pressure sensor such as a piezoelectric element, although other forms of sensors can be accommodated. This signal is applied to an input amplifier 11 having a feedback network 12 connected between the output and input of the amplifier to characterize the normal operating curve of the amplifier to compensate for non-linearities in the meter sensor.

The output of amplifier 11 is applied to a tracking filter constituted by a capacitor $C_1$ and resistors $R_1$ and $R_2$. Resistor $R_1$ is connected to ground through a normally-open electronic switch $S_1$ and resistor $R_2$ being connected to ground through a normally-open electronic switch $S_2$. When these switches are open the output of the amplifier is unfiltered.

The output of amplifier 11 is applied to a Schmitt trigger constituted by an operational amplifier 14 having a positive feedback resistor 15 connected between the output and the non-inverting input terminal (+) thereof. The meter signal from the output of amplifier 11 is applied to the inverting input terminal (−) of the operational amplifier 14 and is changed by the Schmitt trigger into square wave pulses. The positive feedback results in a differential between the switch "on" and switch "off" voltage yielded by the trigger. This differential is changed by shorting or unshorting a resistor 16 connected between the non-inverting input of amplifier 14 and common through a fixed resistor 17. Shorting and unshorting of resistor 16 is effected by a normally-open electronic switch $S_4$.

The square wave pulses from the Schmitt trigger are fed into the input pin $P_{14}$ of an integrated-circuit, phase lock loop 18 which functions as the control center of the transmitter. This digital integrator circuit is preferably constituted by an RCA CD 4046 unit whose block diagram is shown in FIG. 2. A more detailed description of this monolithic silicon unit is published by RCA in its File 637 (RCA Solid State Division.)

This unit includes a low-power linear voltage-controlled oscillator VCO and two phase comparators I and II. The input pulses from the Schmitt trigger are applied to pin $P_{14}$ connected to a signal input amplifier. Pin $P_3$ is the common input to comparators I and II. An external capacitor $C_2$ is connected between pins $P_6$ and $P_7$ of the VCO, this capacitor in conjunction with an external resistor $R_3$ connected to pin $P_{11}$ determining the frequency range of the VCO.

The VCO has a demodulator output pin $P_{10}$ which is buffered by a source follower, the voltage yielded at this pin being an analog of the VCO frequency. Phase comparator I has excellent noise rejection; however, it can only capture a relatively narrow frequency range, usually less than 20 to 1, and it can lock in harmonics of the fundamental frequency. Because phase comparator II can operate and capture over a large frequency range, use is made only of this comparator in the system in accordance with the invention. The output of comparator II at pin $P_{13}$ is connected through a low-pass filter formed by resistor $R_4$ and capacitor $C_3$ to the input of the VCO at pin $P_9$.

In operation, the square wave pulses from the Schmitt trigger 14, whose frequency is proportional to the flow rate, is applied to pin $P_{14}$ of the phase-locked loop 18 and is compared by phase comparator II to the output square wave of a pulse counter 19 whose input is connected to the VCO output at pin $P_4$ and whose output is connected to pin $P_3$, the input to comparator II.

The output of phase comparator II which is yielded at pin $P_{13}$, after filtering, drives the input of the VCO up or down until the frequency at pin $P_3$, the output of the counter, equals the frequency at pin $P_{14}$, the pulse signal input to the unit. The multiplication ratio of the VCO output can be adjusted by changing the division rate of the counter.

The operation described thus far represents the standard application of the phase-locked loop as a frequency multiplier. However, in addition to its role as a phase-locked loop, the unit also generates the control signal for the tracking filter which includes resistors $R_1$ and $R_2$ and for the zero-flow protection circuits.

Also provided is normally-open electronic switch $S_3$, which, when actuated and closed, connects the multiplied frequency output of unit 18 taken from pin $P_4$ to the input transistor $Q_1$ of a two-wire line frequency transmitter which further includes a second transistor $Q_2$ and a voltage regulator. Such two-wire frequency transmitters are well-known and will therefore not be further described. Alternative, the transmission may be on a two-wire line current transmitter, in which case the multiplied frequency from pin $P_4$ is first converted by an F/E converter into a corresponding voltage which in turn is converted by an E/I converter into a current proportional thereto. Because the system is characterized by extremely low power consumption the system lends itself to transmission on a two-wire current line (4 to 20 Ma) or to a two-wire frequency line.

The input voltage to the VCO on pin $P_9$ is essentially proportional to the input frequency, and the buffered output voltage on pin $P_{10}$ is therefore also essentially proportional to the input frequency and is an analog thereof. The analog voltage from $P_{10}$ is applied to a comparator assembly 20 constituted by comparators X, Y and Z, where it is compared against fixed d-c reference voltages defined by a voltage divider formed by a series of resistors to which a voltage (+5 V) is applied. Progressively higher voltages are provided at each of the junctions x, y and z in the series of resistors.

Comparator Z is in an "on" condition and produces an output voltage which acts to simultaneously actuate electronic switches $S_3$ and $S_4$ when the frequency of the input pulses applied to pin $P_{14}$ of unit 18 lies anywhere between the minimum and maximum values in the full operating range. By way of example, we shall assume the operating range to be from 3.5 Hz to 52 Hz. When switch $S_3$ is closed, the output of the system is applied to the two-wire transmission line or any other utilization device; and when switch $S_4$ is closed, resistor 16 is shorted to change the differential of the Schmitt trigger.

When, however, the input pulse frequency at pin $P_{14}$ is below 3.5 Hz, which is the minimum operating frequency, the difference between the reference voltage at junction z and the analog voltage from pin $P_{10}$ applied to comparator Z is such as to put the comparator in an "off" condition, as a consequence of which switches $S_3$ and $S_4$ are caused to open, and no signal is then transmitted.

When the frequency of the input pulses is above 19 Hz, the resultant analog voltage as compared to the reference voltage at junction y of voltage divider 21 is such as to render comparator Y operative which then causes switch $S_1$, operatively coupled thereof, to close and render resistor $R_1$ effective in the tracking filter. And when the frequency of the input pulses rises above 31 Hz, then the resultant analog voltage, as compared to the reference voltage at junction x, causes comparator X to turn on and close switch $S_2$ to insert resistor $R_2$ into the tracking filter.

Operation

Referring now to FIG. 3, in which the operating frequency Hz of a commercial vortex flowmeter marketed by Fischer & Porter Company of Warminster, Pa., as model LV3, is plotted against amplifier gain, curve S represents the sensor signal from the force sensor in this meter. Curve (1) is the frequency response curve of the input amplifier 11, which amplifier is characterized by network 12. This curve does not reflect the effect of the tracking filter on the gain, for switches $S_1$ and $S_2$ are then open and resistors $R_1$ and $R_2$ are out of the circuit.

Curve (2) represents the frequency v. gain response of the amplifier when switch $S_1$ is closed and resistor $R_1$ is operative, this occurring when the meter frequency is above 19 Hz, in which state the gain rolls off below 19 Hz. Curve (3) represents the frequency v. gain response of this amplifier when switches $S_1$ and $S_2$ are both closed and resistors $R_1$ and $R_2$ are switched into the tracking filter, this occurring when the meter frequency rises above 31 Hz. In this condition, the gain rolls off below 31 Hz.

Since the system gain at other than the operating frequency is considerably reduced, the signal-to-noise ratio is substantially improved and the effect of jitter is minimized. While the invention is disclosed in connection with a tracking filter with two switching steps, in practice a greater number of steps may be used, so that in an operating range of, say, from 4 to 70 Hz, the switching points may be at 15 Hz, 30 Hz, 45 Hz and 60 Hz.

FIG. 4 shows the system gain (sensor and amplifier) with a pressure or force sensor of the type incorporated in a Fischer & Porter model LV-3 vortex-shedding flowmeter for liquid, the instrument having a 4-inch diameter. Curve (1) in this figure is the gain when the meter operates in the range of 3.5 Hz to about 19 Hz with switches $S_1$ and $S_2$ open and switches $S_3$ and $S_4$ closed. Curve (2) is the gain in the range of 19 Hz to about 31 Hz with switches $S_1$, $S_3$ and $S_4$ closed and switch $S_2$ open, while curve (3) is the gain with all switches closed.

This particular system gain favors the high end of the range and results in a relatively uniform signal-to-noise ratio for shedders with pressure or force sensors. Thermal or ultrasonic sensors would dictate a flatter system gain curve.

FIGS. 5 and 6 illustrate the effect of switching the Schmitt differential at "0" flow. At minimum flow when the signal is smallest, the operating Schmitt differential is selected so that the trigger will never miss converting the signal to a square wave. But when the meter frequency drops 10 to 20% below the operating frequency, comparator Z switches and widens the differential to a point where a very small percentage of misses (A and B) would occur. And when the meter frequency climbs to minimum flow even with a few misses, the frequency is again high enough to switch the Schmitt trigger to an operating mode and normal operation takes place.

FIG. 6 illustrates the fact that "0" flow noise which might trigger the Schmitt with operating differential will not trip the Schmitt with "0" flow differential. Since the signal cur-off switch $S_3$ does not allow an output unless comparator Z is on, even an occasional trip will not cause output unless the frequency exceeds the minimum cut-off frequency.

While there has been shown and described a preferred embodiment of a transmission system for vortex-shedding and swirl-type flowmeters in accordance with the invention, it will be appreciated that many changes and modifications may be made therein without, however, departing from the essential spirit thereof.

I claim:

1. A transmission system for a vortex-shedding or swirl-type flowmeter whose meter frequency lies in a low-frequency range and is a function of the flow rate of the fluid being metered, said system comprising:
   A. an input amplifier responsive to the meter signal to yield an amplified signal which depends on the frequency vs. gain characteristics of the amplifier;
   B. circuit means including a frequency multiplier to convert said amplified signal to an output signal which lies in a high frequency range, said circuit means also yielding a voltage which is an analog of said meter frequency;

C. a tracking filter interposed between said amplifier and said circuit means to characterize the amplifier response to reduce the amplification gain thereof below a selected frequency level; and D. a comparator assembly coupled to said filter to compare said analog voltage with a series of progressively increased reference voltages each of which represents a predetermined frequency level, the assembly functioning to render the filter operative in a stepwise manner whereby when the meter frequency reaches any one of the predetermined levels, the filter then acts effectively to reduce the amplification gain to attenuate frequencies below that level.

2. A transmission system as set forth in claim 1, further including a Schmitt trigger coupled to the output of said filter to convert said filtered meter frequency into corresponding pulses, said pulses being applied to said multiplier.

3. A transmission system as set forth in claim 2, wherein said Schmitt trigger has a differential which is altered when the meter frequency falls below a predetermined minimum level.

4. A transmission system as set forth in claim 3, wherein said differential is altered by a resistor connected in the circuit of the Schmitt trigger, which resistor is shorted by an electronic switch that is actuated when the analog voltage falls below the lowest of said reference voltages.

5. A system as set forth in claim 1, wherein said comparator assembly includes a group of comparators, one for each of said series of reference voltages, each comparator being actuated when the analog voltage applied thereto reaches a level at least equal to that of the related reference voltage.

6. A system as set forth in claim 5, wherein said filter is composed of a capacitor and two resistors which are connected by respective normally-open electronic switches to said capacitor, said switches being coupled to two of said comparators and being actuated thereby.

7. A system as set forth in claim 1, further including a third electronic switch coupled to a third comparator and acting to disconnect said filter from said circuit means when said third comparator receives an analog voltage indicative of zero fluid flow.

8. A system as set forth in claim 1, wherein said multiplier is constituted by a phase-locked loop operating in conjunction with a counter.

9. A system as set forth in claim 1, wherein said loop includes a voltage-controlled oscillator to produce a signal which is a multiple of said analog voltage.

* * * * *